United States Patent [19]

Fujita et al.

[11] Patent Number: 4,631,816
[45] Date of Patent: Dec. 30, 1986

[54] AUTOMATIC APPARATUS FOR MOUNTING ELECTRONIC PARTS

[75] Inventors: Takayuki Fujita, Hirakata; Shigetoshi Negishi, Suita; Kunio Tanaka, Kadoma, all of Japan

[73] Assignee: Matsushita Electric Industrial Co., Ltd., Kadoma, Japan

[21] Appl. No.: 702,032

[22] Filed: Feb. 15, 1985

[30] Foreign Application Priority Data

Feb. 17, 1984 [JP] Japan ................................. 59-28911

[51] Int. Cl.[4] .............................................. H05K 3/32
[52] U.S. Cl. ...................................... 29/740; 29/741; 29/759; 29/836; 29/840
[58] Field of Search ................. 29/741, 740, 739, 759, 29/840, 834, 836

[56] References Cited

U.S. PATENT DOCUMENTS 4,434,550  3/1984  Wilke et al. ..................... 29/741 X Primary Examiner—Carl E. Hall
Attorney, Agent, or Firm—Wenderoth, Lind & Ponack

[57] ABSTRACT

An automatic apparatus for mounting electronic parts on a printed circuit board includes a turntable, a plurality of mounting heads mounted in positions spaced at equal distances around the turntable, a plurality of mounting chucks movably mounted on each of the mounting heads and each having a shape for picking up a different shape electronic part, cams disposed around the periphery of the turntable and engageable with the mounting heads for positioning one mounting chuck on each of the mounting heads in a position for picking up a desired part, carrying the part around the periphery of the turntable and mounting it on the printed circuit board, and a device to drive the mounting chucks to pick up an electronic part and to mount electronic part picked up on the printed circuit board.

9 Claims, 21 Drawing Figures 1a  1b  1c  1d

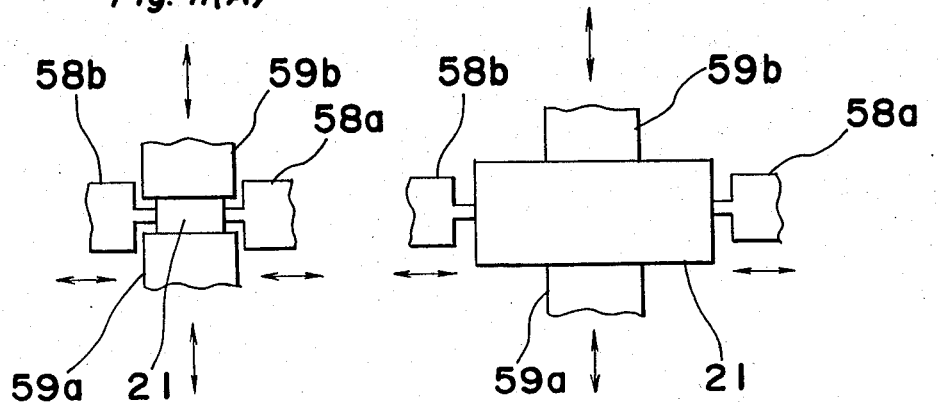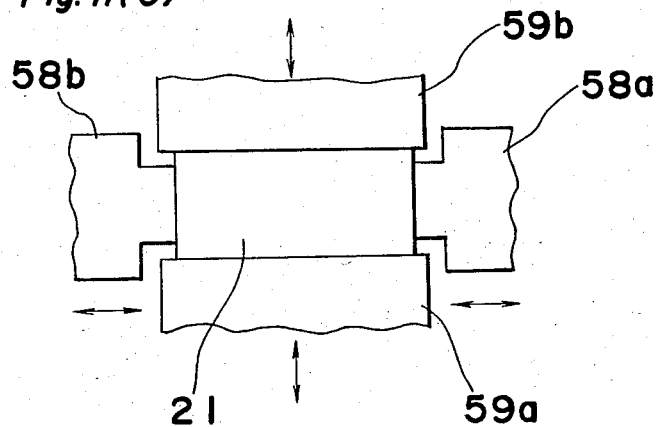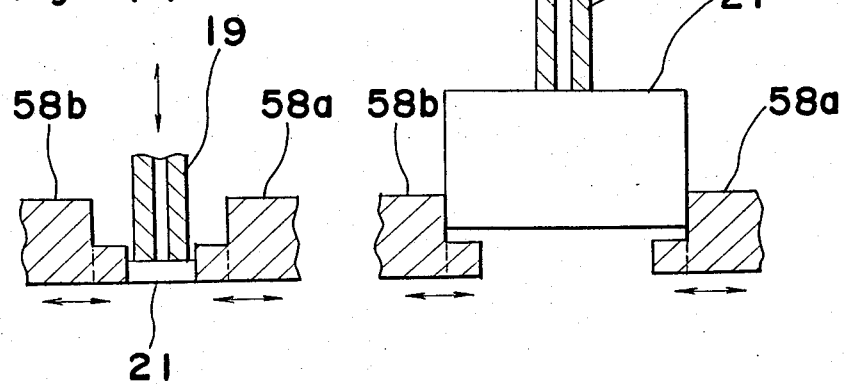

AUTOMATIC APPARATUS FOR MOUNTING ELECTRONIC PARTS

BACKGROUND OF THE INVENTION

1. Field of the Invention

The present invention relates to an automatic apparatus for mounting electronic parts, which engages electronic chip type parts on a printed circuit board constituting the circuit portion of electronic devices.

2. Description of the Prior Art

Conventionally varous chip type parts 1a through 1d shown in FIGS. 1(A) through 1(D) are supplied to a user in a tape shaped carrier having an adhesive tape backing 4 and base paper strip 3 having many part accommodating recesses 2 formed therein at equal distances as shown in FIG. 2. To mount the electronic parts from the carrier onto the circuit board, an automatic apparatus for mounting electronic parts of a single head type as shown in FIG. 3 is generally employed.

In the automatic apparatus for mounting electronic parts shown in FIG. 3, a plurality of parts cassettes 5, each having various electronic parts therein, is provided on a casing 10, and are adapted to be movable in a direction Z so that parts to be mounted may be selected from a certain cassette. In operation a mounting chuck 6 picks up electronic part positioned in its pick-up position, and a positioning pawl 7 positions by a positioning operation. Also, the mounting chuck 6 mounts the electronic parts on the print circuit board 9 which is positioned by an X-Y table 8 which is movable in two directions X and Y. However, in this mechanism, the mounting chuck 6 picks up the electronic part and the positioning pawl 7 positions it for the mounting operation, thus resulting in complicated operations. The parts cassette 5 and the X-Y table 8 are moved relative to the mounting chuck 6 to mount the parts on the printed circuit board 9 and thereafter return the desired cassette to allow pick up of the next electronic part, thus resulting in low mounting speed. Furthermore, one mounting chuck 6 cannot handle all the electronic parts in accordance with their size and type. Accordingly, an automatic apparatus for mounting electronic parts for exclusive use for limited sizes of parts is necessary in accordance with the sizes and types of the electronic parts.

FIG. 4 shows a top-plan view of an automatic apparatus for mounting electronic parts of the turntable type, which has an improved mounting speed. In this automatic apparatus for mounting electronic parts, a plurality of parts cassettes 5 are adapted to be moved in the direction Z, as in the mounting apparatus of FIG. 3, for the choice of the mounting parts. The electronic parts are picked up by a positioning and mounting unit 12 in the position (A) and thereafter a turntable 11 rotates. In the position (B), the position and mounting unit 12 holding electronic parts by its pawls 12a through 12d determines the position and the mounting direction of the electronic parts, and, in the position (C), the mounting chuck 13 is adapted to place the electronic parts on the printed circuit board 9 on the X-Y table 8 to perform the mounting operation. According to this arrangement, each operation is simplified, the operation distance can be shortened, the turntable 11 is rotated, indexing in one direction, so that this apparatus has a faster mounting speed than the apparatus of FIG. 3. However, as the mounting chuck 13 is a single type, various kinds of electronic parts cannot be mounted because of changes in the size and type. Thus, an automatic apparatus for mounting electronic parts for exclusive use for limited sizes of parts is required in accordance with the type of each of the electronic parts.

SUMMARY OF THE INVENTION

Accordingly, an object of the present invention is to provide an automatic apparatus for mounting electronic parts, wherein mounting chucks of units can be provided for the various shapes of the electronic parts with high reliability and superior efficiency.

Another object of the present invention is to provide an automatic apparatus for mounting electronic parts, where the mounting chucks are adapted to undergo vertical movement only with providing the positioning operation for electronic parts made by the holding and mounting operation thereof made in a direction during the indexing operation, so that the two operations can be divided, the mounting speed can be improved and the mounting of electronic parts can be performed with high productivity.

A further object of the present invention is to provide an automatic apparatus for mounting electronic parts, wherein in the mounting chucks the mounting head is pivotably movable so that the picking up, positioning and mounting operations of the mounting chuck may be performed at one location and with one positioning unit and the parts cassettes are provided as a unit, whereby the electronic-parts feeding, base paper strip delivering and backing removal operations can be easily performed.

According to the present invention, there is provided an automatic apparatus for mounting various kinds of electronic parts, comprising a turntable, a plurality of mounting heads mounted in positions spaced at equal distances around the turntable, a plurality of mounting chucks movably provided respectively in the mounting heads and being mutually different in shape, cams disposed on the periphery of said turntable, said cams being adapted to actuate one mounting chuck provided on each of the mounting heads, while the selected mounting chuck picks up electronic parts to mount said electronic parts on the printed circuit board, so the electronic parts different in shape can be mounted on the substrate at a faster mounting speed.

BRIEF DESCRIPTION OF THE DRAWINGS

These and other objects and features of the present invention will become apparent from the following description of the preferred embodiments thereof taken in conjunction with the accompanying drawings, in which:

FIGS. 11(A) through 11(C) and FIGS. 12(A) and 12(B) are plan view and elevation view, respectively, each showing the mounting operation of the apparatus.

DESCRIPTION OF THE PREFERRED EMBODIMENTS

Figures 1A, 1B, 1C, 1D:
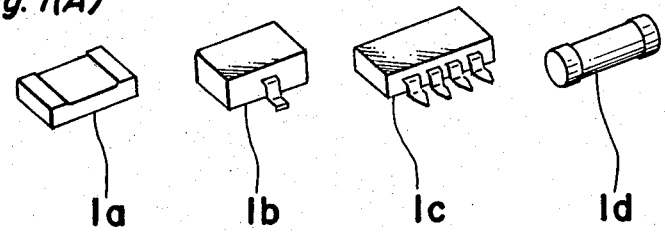
FIGS. 1(A) through 1(D) are perspective views showing chip type electronic parts.
Figure 3:
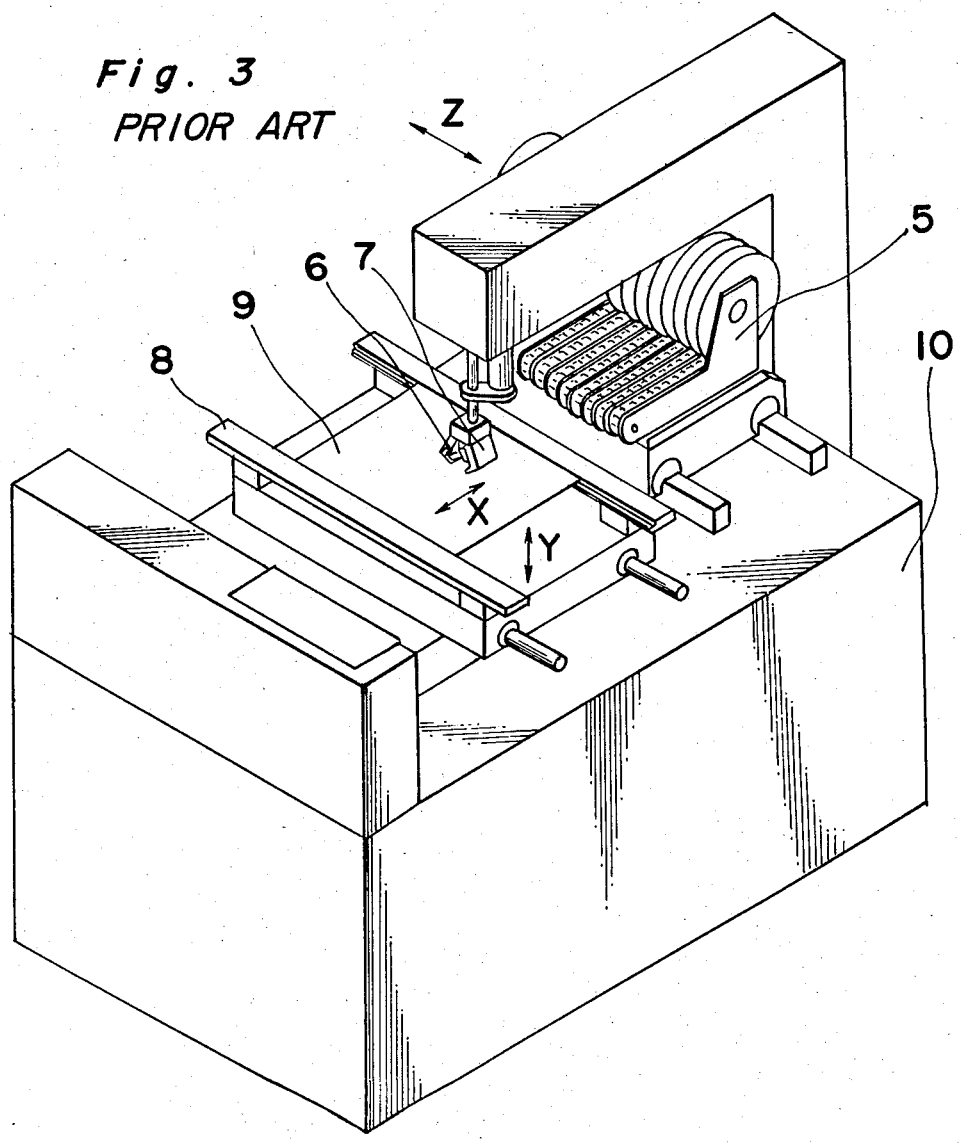
FIG. 3 is a perspective view showing a conventional automatic apparatus for mounting electronic parts of a single head type (already referred to)
Figure 2:
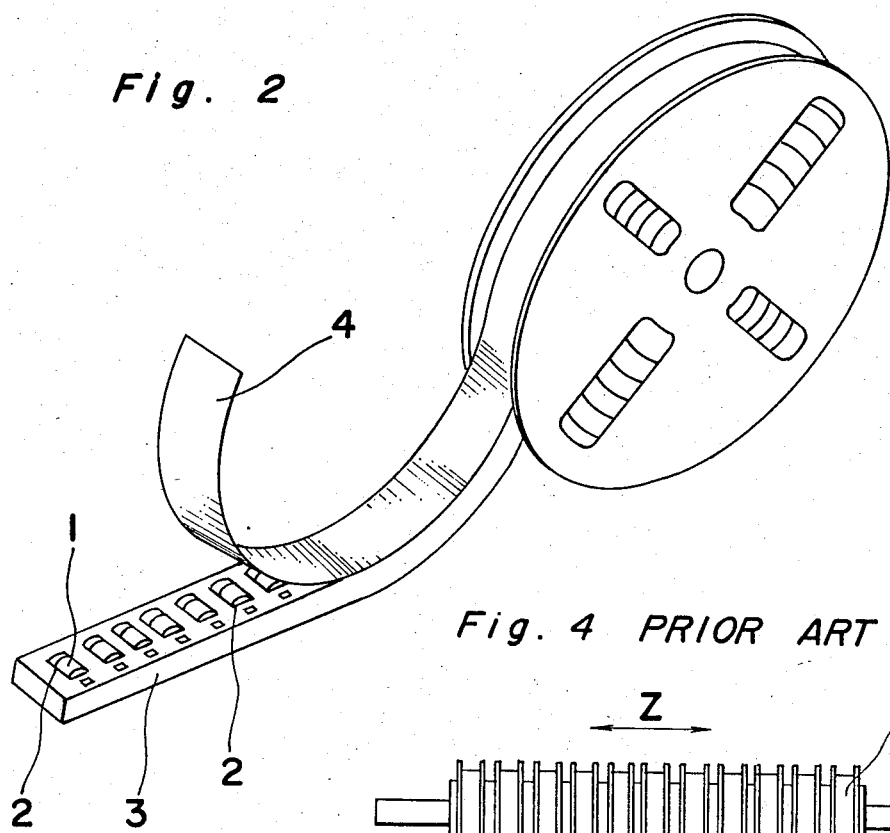
FIG. 2 is a perspective view showing the tape shaped carrier for the chip type electronic parts.
Figure 4:
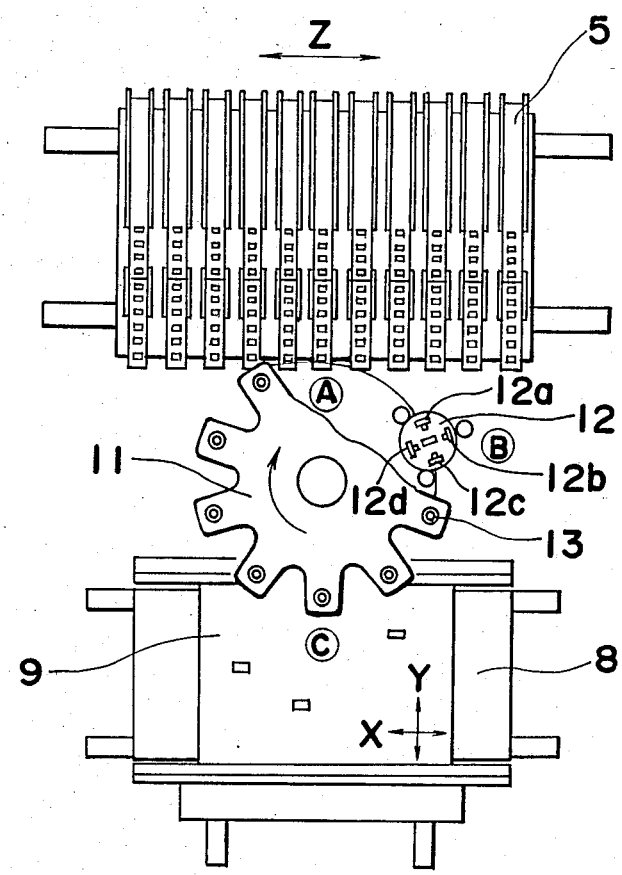
FIG. 4 is a plan view of a conventional automatic apparatus for mounting electronic parts of a turntable type (already referred to)
Figure 5:
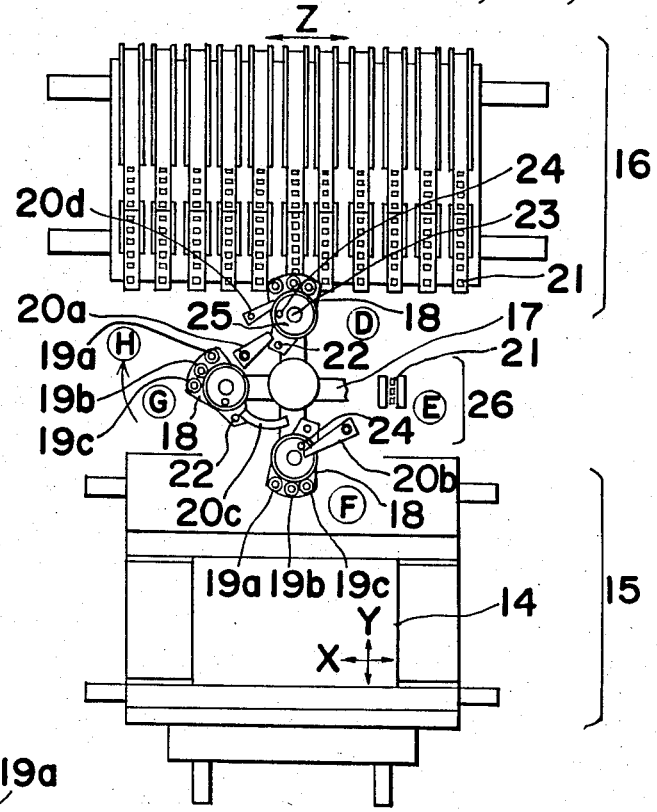
FIG. 5 is a plan view for describing the fundamental construction of an automatic apparatus for mounting electronic parts according to the present invention.

The fundamental construction of an automatic apparatus for mounting electronic parts in accordance with the present invention as shown in FIG. 5 will be described hereinafter at first. Referring to FIG. 5, the automatic apparatus for mounting electronic parts comprises, in principle, an X-Y table 15 for moving a substrate or printed circuit board 14 in the directions of arrows X and Y for the positioning operation, parts cassettes 16 provided near the X-Y table 15 and movable in the direction of the arrow Z, which is the same direction as the direction of an arrow X, and a positioning unit 26, including a turntable 17 disposed between the X-Y table 15 and the parts cassettes 16 and adapted to perform an indexing operation, rotating in the direction of an arrow (H), a mounting head 18 mounted respectively at each of four locations on the turntable 17 and adapted to be pivotable, a plurality of types of liftable and rotatable mounting chucks 19a through 19c disposed, along a circular arc, on the outer periphery of the mounting head 18, a plate-shaped mounting chuck selection cam 20a disposed above the turntable 17, a mounting direction selection cam 20b, an origin return cam 20c and a polarity selection cam 20d. As the turntable 17 moves, the mounting head 18 oscillates around a supporting point 23 among each of the positions (G), (D), (E) and (F), by the motion of a cam follower 22 driven by a cam 20a which is driven in accordance with data determining the type of electronic parts 21 to be mounted, and the mounting head properly positions one of the mounting chucks 19a through 19c for part pick up. For example, one mounting chuck 19b can be selected to pick up an electronic part 21 to be mounted in the position (D), and at the same time a orientation selection cam 20d moves a cam follower 24 to rotate a gear 25 on the supporting shaft 23 to determine the orientation of the mounting chuck 19b. By this means, the mounting chuck 19b can be rotated by 180° when necessary. The positioning unit 26 at position (E) grasps an electronic part 21 which has been picked up at position (D) to perform a positioning operation. A cam follower 24 is rotated around a supporting shaft 23 by a working direction selection cam 20b, which is driven in accordance with data determining the type of the same electronic parts 21, as described hereinabove, during the indexing from the (E) to the (F) position, to determine the mounting direction of the mounting chuck 19b and is rotated up to 90° when necessary. In the position (F), the mounting chuck 19b moves downward to complete the engagement of the electronic part 21 on the printed circuit board 14 with bonding agent printed thereon. An origin return cam 20c is used for return of the mounting chucks 19a through 19c to their original selection position, while the cam 20d is used for return of the mounting chucks to their original mounting direction.

As described hereinabove, in the present embodiment, a mounting chuck 19 having the appropriate shape, even if the shape of the electronic parts 21 differ, can be selected by the mounting chuck selection cam 20a during the rotation of the turntable 17. Accordingly, in the present embodiment, many types of electronic parts can be mounted on the substrate at a faster mounting speed.

Also, in the present embodiment, the orientation selection cam 20d and the mounting direction cam 20b determine the mounting direction of an electronic parts 21 during the rotation of the turntable 17. Accordingly, in the present embodiment, a faster mounting speed can be provided.

In the present embodiment, the electronic part 21 picked up at position (D) is either left as it is or rotated 180° by the polarity selection cam 20d and thereafter is positioned at the positioning unit 26. Then, it is rotated by 0° or 90° in the position (F) by a mounting direction selection cam 20b. In this manner, the electronic part 21 is taken out of the parts cassette 16 and thereafter the mounting directions can be varied in four directions of 0°, 90°, 180° or 270° to perform a faster speed mounting operation on the printed circuit board 14. Also, in the present embodiment, the mounting direction is set by two cams 20b and 20d. Thus, the electronic part 21 to be positioned by positioning unit 26 is 0° or 180° to simplify the construction of the positioning unit 26.

A concrete embodiment of an automatic apparatus for mounting electronic parts in accordance with the present invention will be described hereinafter with reference to FIG. 6 through FIG. 15, in which the same reference characters are given to the same parts.

Figure 6:
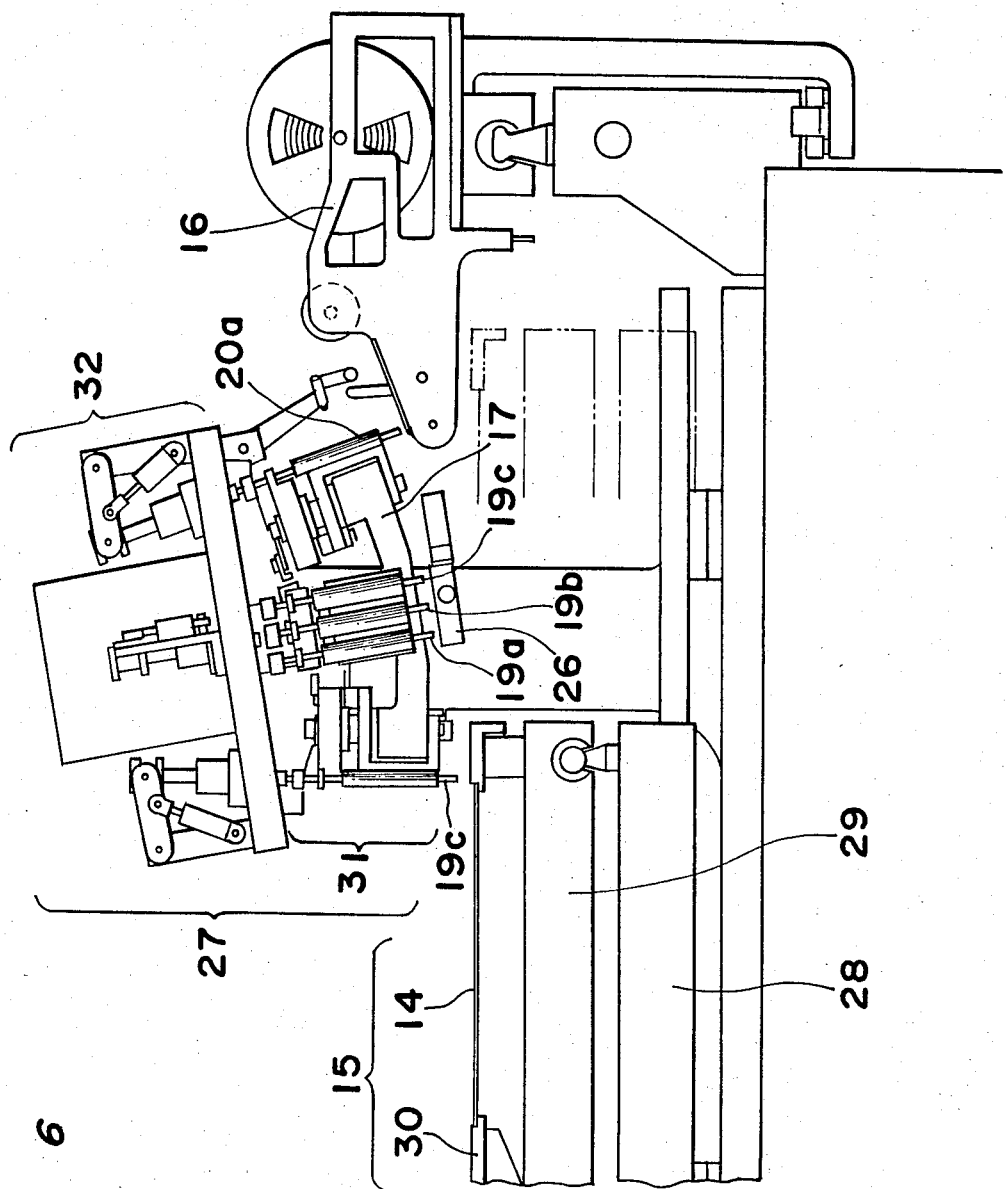
FIG. 6 is a side elevation view of the apparatus.

As shown in the side view of FIG. 6, the automatic apparatus for mounting electronic parts of the present invention is chiefly composed of an X-Y table 15, a mounting mechanism 27 and a plurality of parts cassette 16. According to the X-Y table 15, an X table 29 movable in the direction of the arrow X in FIG. 5 normal to a Y table 28 by a servo motor or the like is provided on the Y table 28 movable in the direction of the arrow Y in FIG. 5 in the depth direction of the mounting apparatus by a servo motor or the like. Furthermore, a rail 30 for retaining the printed circuit board 14 is mounted on the X table 29.

The mounting mechanism 27 is composed of a mounting head 31, a driving means 32 and a positioning unit 26 as shown in FIG. 6. The construction of the mounting head 31 is shown in the enlarged view of FIG. 7.

The mounting chucks 19a through 19c are respectively mounted on the mounting units, and are different in shape. The plurality of different mounting chucks 19a through 19c are mounted for movement up and down on the mounting head 18 and are normally urged upwardly by a spring 33. Also, the mounting heads 18 are adapted to pivot around the supporting shafts 23 and are located in positions spaced at equal intervals on the turntable 17.

The mounting chucks 19a through 19c are supplied with a vacuum through axial bores formed in the mounting chucks 19a through 19c and a vacuum supply passage through the mounting head 18, a bore in the supporting shaft 23 and extending through the turntable 17 sealed by an O ring 35 in the bearing 34.

Figure 7:
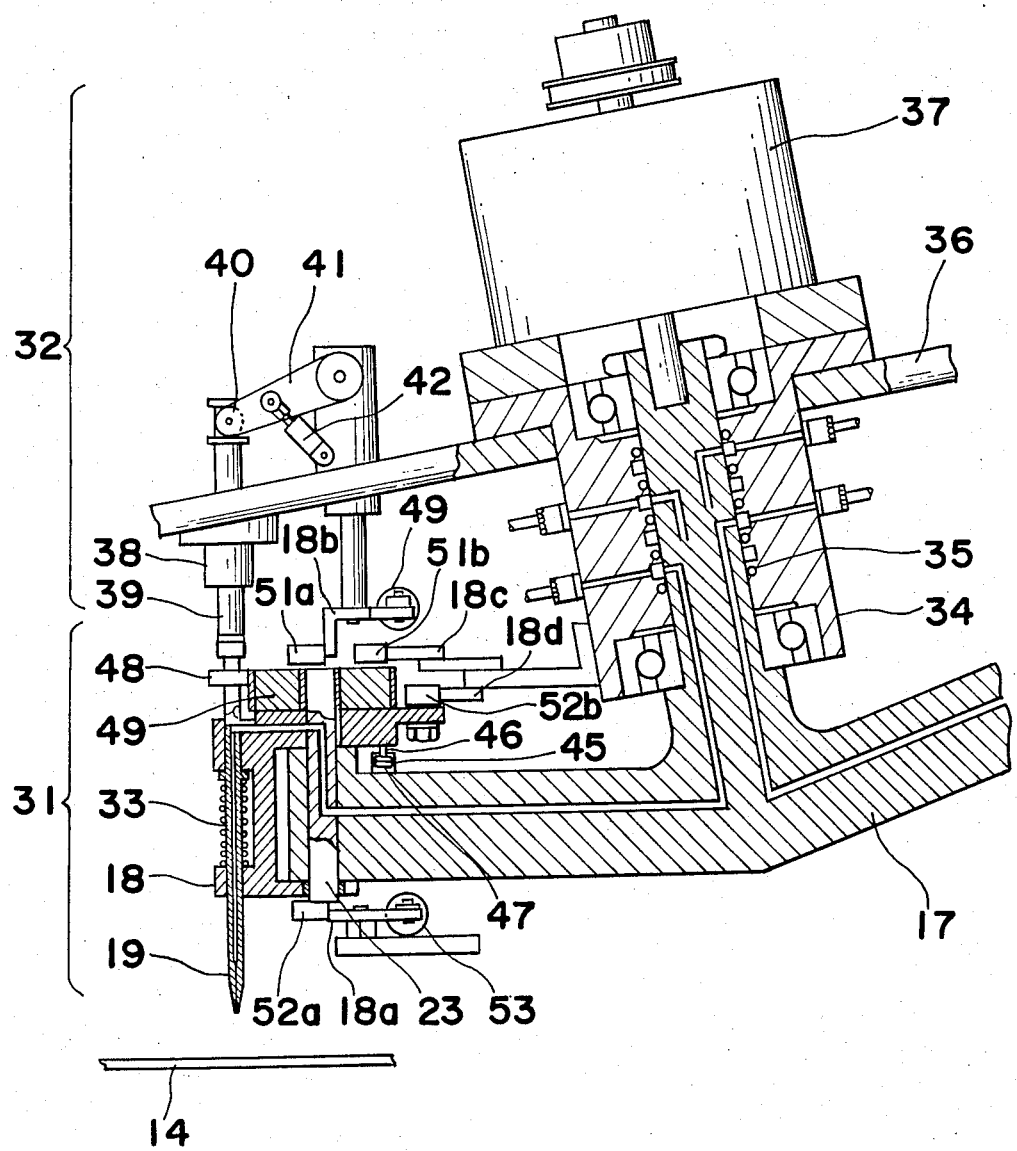
FIG. 7 is an enlarged cross-sectional view of essential portions of the apparatus.

In a driving unit 32 shown in FIG. 7, the turntable 17 is supported by central shaft in a bearing 34 mounted on a base 36, and the shaft has the turntable 17 externally secured thereto, and is coupled to an index unit 37. The index 37 performs its indexing operation so that the turntable 17 rotates. A pusher 39 slidable in a bearing 38 is mounted on the base 36 above each of the mounting chucks 19a through 19c, so that the chucks can be moved down at the stations in the positions of (D) through (F) of FIG. 5 for picking up, positioning and mounting of the parts. The pusher 39 is vertically moved by an air cylinder 42 through a cam follower 40 and a lever 41 and engages the mounting chucks 19a through 19c to cause them to move down.

Figure 8:
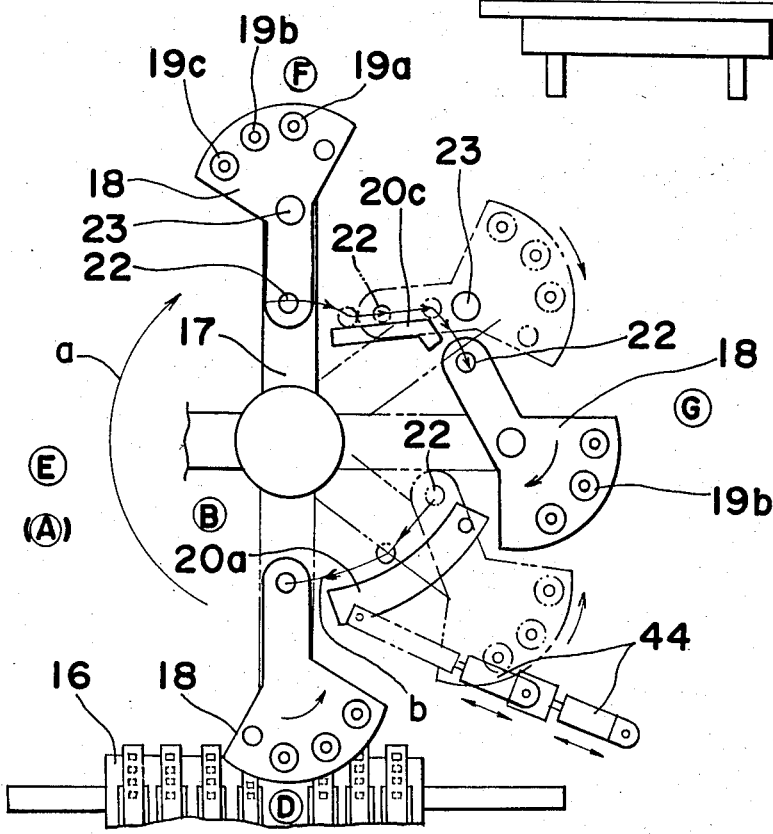
FIG. 8 is a plan view of a mounting chuck selecting mechanism for the apparatus.

The selection mechanism for the mounting chucks 19a through 19c will be described with reference to FIG. 8.

Figure 9:
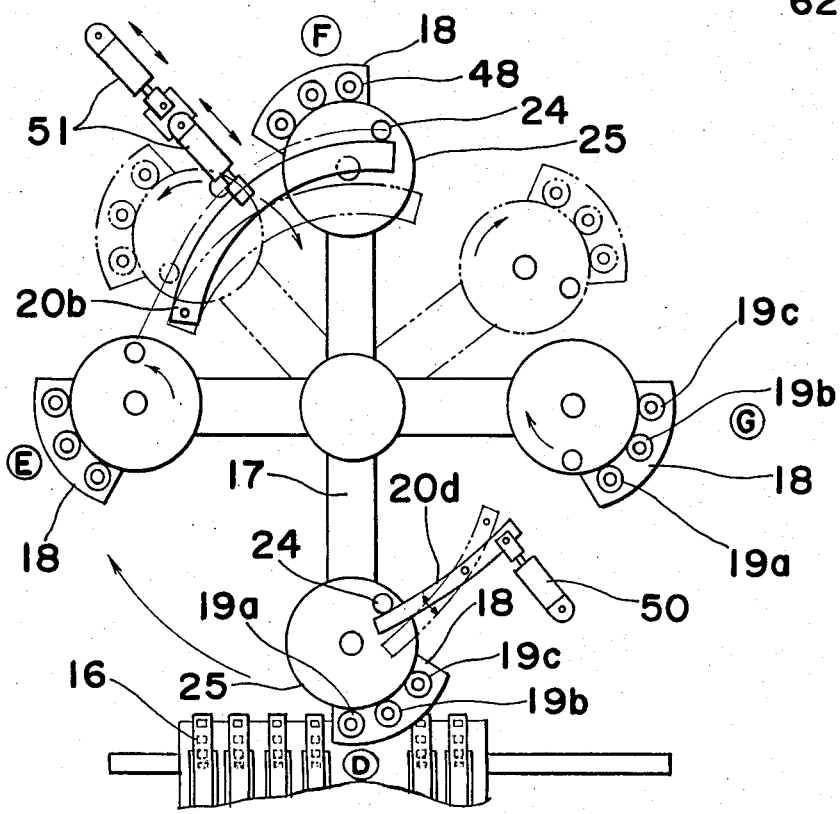
FIG. 9 is a plan view of a mounting direction mechanism of the apparatus.

A mounting chuck 19a selected in the previous operation completes the mounting operation of the electronic part on the print circuit board at the position of (F) and a cam follower 22 mounted on the mounting head 18 comes into contact with a fixed origin return cam 20c as the turntable 17 indexes from the position (F) to the position (G). The mounting head moves in the clockwise direction pivot and return the mounting head 18 to the origin, i.e., the condition of position (G). During the indexing operation from (G) to (D), a mounting chuck selection cam 20a is set in advance by a servo motor or an air cylinder 44, which is adapted to be driven according to data showing the type of the electronic part to be mounted, to be held in a given position. The cam follower 22 on the mounting head 18 hits the mounting chuck selection cam 20a to guide the cam follower 22 along arrow b along the mounting chuck selection cam 20a so that the mounting head 18 is pivoted to the position in which mounting chuck is at the position D. A pin 46 which slides in a bearing block 45 shown in FIG. 7 is urged by a compression spring 47 and the pin corresponding to the selected mounting chuck 19a enters a hole machined in the mounting head 18 to retain the selected mounting chuck 19a in position in the turntable 17. Then, a positioning mechanism for setting the mounting direction of the mounting chucks, mounting chuck 19a in the example, is operated. As shown in FIG. 7, a pinion gear 48 is mounted on the top of the mounting chuck 19 and is meshed with a sector gear 49. The sector gear 49 rotates around a supporting shaft 23 to rotate the mounting chuck 19. A selection mechanism for selecting the mounting direction of the mounting chuck 19 is shown in FIG. 9. When the orientation of the electronic parts is opposite to the desired orientation in the position (D), the sector gear 25 is rotated by a polarity selection cam 20d, if necessary, driven by an air cylinder 50 or the like to rotate the mounting chucks 19a through 19c, rotating them by 180°. The mounting chuck 19a is then lowered by cylinder Z to pick up an electronic part 21 from the a parts cassette 16 which has been moved into position thereunder and then raised. After the positioning of the mounting parts at (E), a mounting direction selection cam 20b is set in advance by a servo motor or an air cylinder 51 and driven according to data showing the shape of the electronic part while the turntable 17 indexes and is kept in a given position. The cam follower 24 mounted on the sector gear 25 hits the mounting direction selection cam 20b and moves along the mounting direction selection cam 20b to rotate sector gear 25 to rotate pinion gear 48 to set the mounting direction of the mounting chucks 19a through 19c. After the part has been mounted on the circuitboard at (F), the cam follower 24 of the sector gear 25 hits the origin return cam 20c as shown in FIG. 8 during the indexing operation from (F) to (G) to rotate and return the sector gear 25 to the origin, i.e., the condition of (G), this portion not being shown in FIG. 9.

Figure 10:
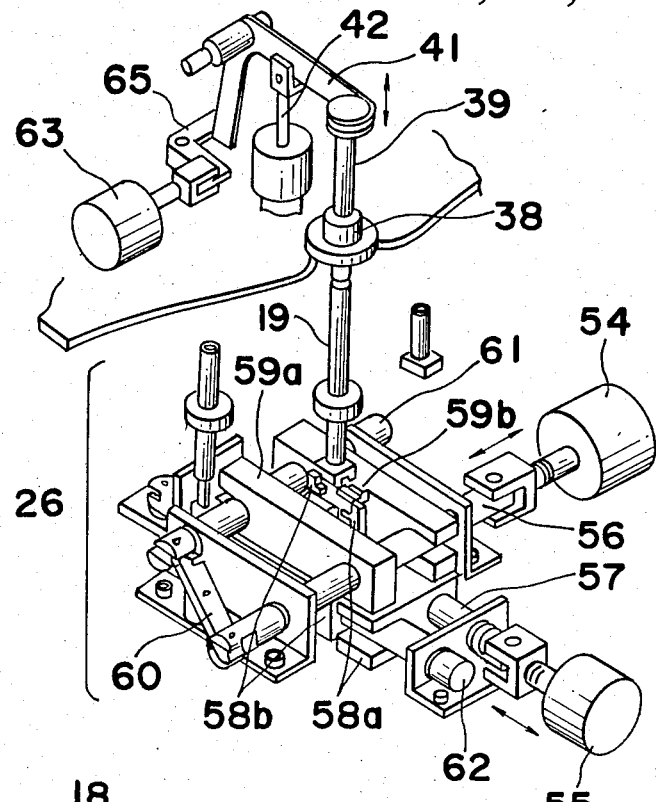
FIG. 10 is a perspective view of the essential portion of a position controlling mechanism of the apparatus.

The position unit 26 is shown in detail hereinafter in FIG. 10. Referring to FIG. 10, the air cylinders 54 and 55 drive shafts 56 and 57 to move an X direction positioning block 58a and a Y direction positioning block 59a secured on shafts 56 and 57. Also, a lever 60 is coupled to the tip ends of each of the shafts 56 and 57. The levers 60 oscillate to move shafts 61 and 62 which in turn move an X direction positioning block 58b secured to the shaft 62 and a Y direction positioning block 59b secured to the shaft 61 to position the blocks 58b and 59b and the electronic parts 21. But when the end shape of the positioning blocks 58a, 58b, 59a and 59b is tried to be put into common use, independently of the size of the parts, an unstable positioning operation is performed. For example, when the end shape for the small parts 21 of FIG. 11(A) is applied to the large parts 21 of FIG. 11(B), and the end becomes so small that the position operation becomes difficult. Therefore, the large part engaging ends are required to be made wider as in FIG. 11(C). To avoid this problem, the end portion of the positioning block is stepped as shown in FIG. 12 so that the small parts may be held in a lower position as shown in FIG. 12(A) and the large parts may be held in an upper position as shown in FIG. 12(B).

The upper, lower selection is performed by an air cylinder 63 shown in FIG. 10. The air cylinder 63 is coupled to a lever 64 and stops the oscillation of the cam 41 driven by the cylinder 63 so that the amount the mounting chucks 19a through 19c on a pusher 39 is shifted to perform the upper or lower position gripping is controlled.

Figure 13:
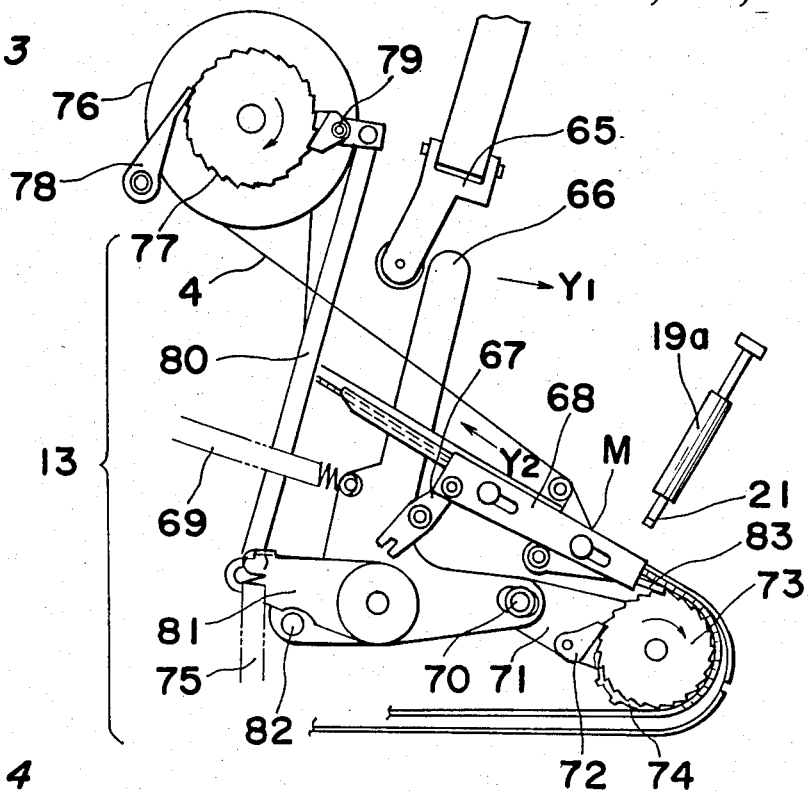
FIG. 13 through FIG. 15 are elevation and perspective views, each showing the parts cassettes of the apparatus.
Figure 14:
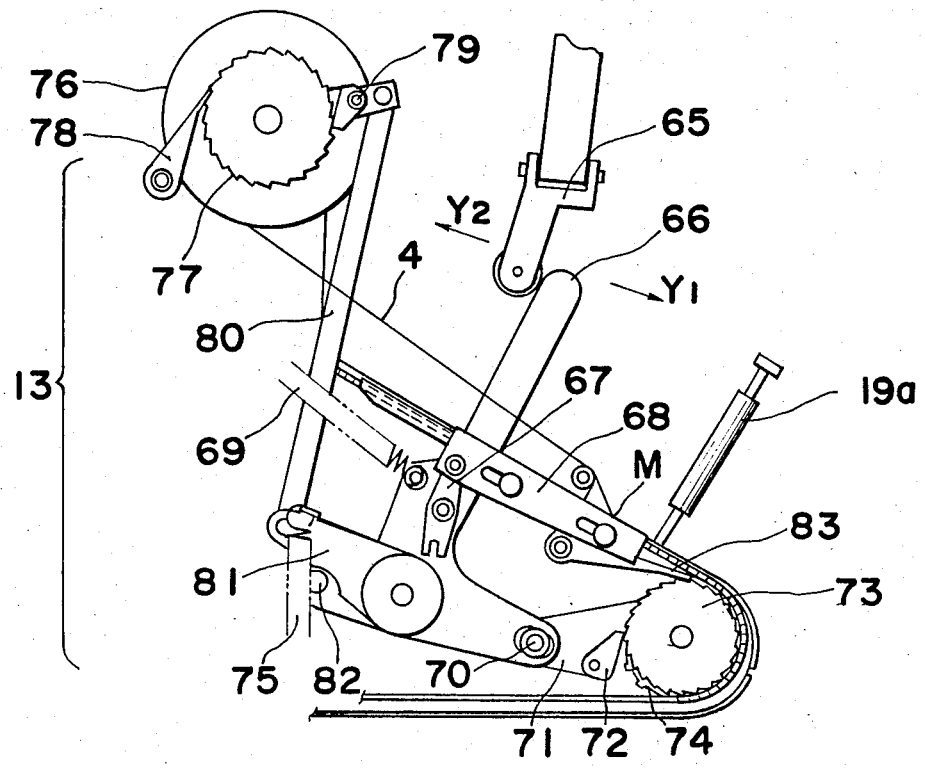
Figure 15:
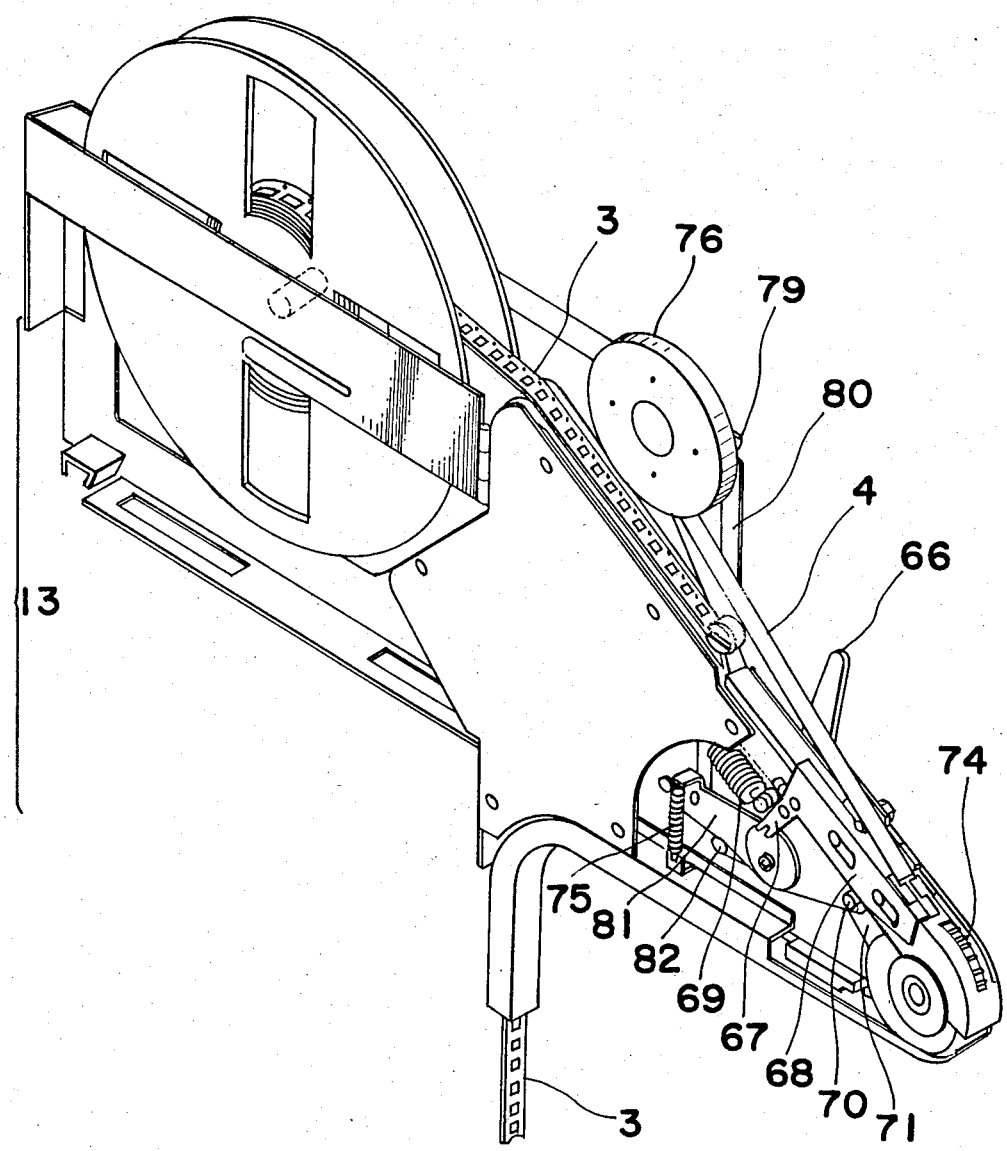

A plurality of parts cassettes 16 of FIG. 5 respectively hold various electronic parts 21 so that a selection can be made by moving the cassettes in the direction Z by a servo motor or the like. A parts cassette 16 will be described with reference to FIG. 13 through FIG. 15. Immediately before the mounting chuck 19a moves down at position (D), a feed lever 65 moves in the direction of Y1, as shown in FIG. 13, kicks feed lever 66 of the parts cassettes 16, which moves a shutter 68 holding an electronic parts carrier by means of an inversion lever 67 to move the carrier in the direction of Y2 so that the mounting chuck 19a can pick up an electronic part and prepare to raise it as shown in FIG. 14. Then, upon the return of the feed layer 65, the feed lever 66 returns under the tension of spring 69 and rotates a feed ratchet 73 by a pawl 72 and a ratchet lever 71 connected with the feed lever 65 by a roller 70, thereby to feed the base paper strip 3 by a hook pawl 74 secured to the feed ratchet. On the other hand, the adhesive tape backing 4 is adapted to be peeled off in the direction opposite to the feed of the base paper strip from the position of the slit M because of the urging force of the spring 75 and is wound up on a take-up reel 76. A ratchet 77, a ratchet lever 78, a ratchet 79, a link 80 and an oscillation lever 81 are coupled to the feed lever 66 through a roller 82 as means for rotating the take-up reel 76.

The automatic apparatus for mounting electronic parts, in accordance with the present invention, constructed as described hereinabove has the following effects and is considered to be very useful in the future in the printed circuit board assembly art. Accordingly, the industrial value is great.

(1) Mounting chucks which are fitted to the shapes of the electronic parts can be provided, and the mounting operation thereof has high reliability. Also, one unit can mount several types of different electronic parts, and the arrangement is superior in efficiency.

(2) The mounting chucks allow vertical movement only. As the positioning operation requires only holding and the direction orienting operation is provided during the indexing operation, the mounting operation can be divided and the mounting speed can be improved, and the apparatus is higher in productivity.

(3) A plurality of mounting chucks are successively operated. However, because the mounting head is pivotably mounted so that the pick up, positioning and mounting operations of the mounting chuck are performed at successive locations, one positioning unit will do. Also, the parts cassettes are provided as a unit. Therefore, the electronic-parts feeding, base paper strip delivering and adhesive-tape backing removal operations can be easily performed.

Although the present invention has been fully described by way of example with reference to the accompanying drawings, it is to be noted here that various changes and modifications will be apparent to those skilled in the art. Therefore, unless otherwise such changes and modifications depart from the scope of the present invention, they should be construed as being included therein.

What is claimed is:

1. An automatic apparatus for mounting electronic parts on a printed circuit board, comprising:
   a turntable;
   a plurality of mounting heads mounted in positions spaced at equal distances around said turntable;
   a plurality of mounting chucks movably mounted on each of said mounting heads and each having a shape for picking up a different shape electronic part;
   cam means disposed around the periphery of said turntable and engageable with said mounting heads for positioning one mounting chuck on each of said mounting heads in a position for picking up a desired part, carrying the part around the periphery of said turntable and mounting it on the printed circuit board; and
   means connected to said mounting chucks to drive said mounting chucks to pick up an electronic part and to mount the electronic part picked up on the printed circuit board.

2. An automatic apparatus as claimed in claim 1 wherein said mounting chucks are rotatably mounted on the corresponding mounting head and movably mounted on the corresponding mounting head for movement parallel to the axis of rotation of said mounting head for picking up and mounting the electronic part.

3. An apparatus as claimed in claim 1 wherein said cam means comprises a first cam for engaging said mounting heads and causing said mounting heads to rotate for positioning one mounting chuck in the pick up position, and a second cam for engaging at least said one mounting chuck for rotating said one mounting chuck for orienting it for picking the electronic part up with the part oriented in a desired direction.

4. An apparatus as claimed in claim 3, wherein said first cam is adjustable for causing a particular one of said mounting chucks to be positioned in the pick up position depending on the adjusted position of said first cam.

5. An automatic apparatus for mounting electronic parts on a printed circuit board, comprising:
   a turntable;
   a plurality of mounting heads mounted in positions spaced at equal distances around said turntable;
   a plurality of mounting chucks movably mounted on each of said mounting heads and each having a shape for picking up a different shape electronic part;
   a first cam for engaging said mounting heads and causing said mounting heads to be moved for positioning one mounting chuck in a pick up position for picking up an electronic part;
   a second cam for engaging at least said one mounting chuck for rotating said one mounting chuck for orienting it for picking up the electronic part with the part oriented in a desired direction;
   a third cam for engaging at least said one chuck for rotating said one mounting chuck to orient the electronic part in the desired mounting direction;
   means connected to said mounting chucks to drive said mounting chucks to pick up an electronic part and to mount the electronic part on the printed circuit board; and
   positioning means positioned adjacent the periphery of said turntable between said second and third cams and engageable with the electronic part held by a mounting chuck for adjusting the position of the electronic part.

6. An automatic apparatus for mounting electronic parts on a printed circuit board, comprising:
   an X-Y table for supporting a printed circuit board and positioning it in a desired position;
   a plurality of parts supplying cassettes positioned adjacent said X-Y table and being shiftable for presenting a different cassette to a part pick up position;
   a turntable positioned between said cassettes and said X-Y table;
   a plurality of mounting heads mounted in positions spaced at equal distances around said turntable;
   a plurality of mounting chucks movably mounted on each of said mounting heads and each having a shape for picking up a different shape electronic part;
   cam means disposed around the periphery of said turntable and engageable with said mounting heads for positioning one mounting chuck on each of the mounting heads in the pick up position as said turntable is rotated for picking up a desired part, carrying the part around the periphery of said turntable and mounting it on the printed circuit board;
   means connected to said mounting chucks to drive said mounting chucks to pick up an electronic part and to mount the electronic part picked up on the printed circuit board.

7. An apparatus as claimed in claim 6 wherein each mounting head has a lever thereon, and a supporting shaft on said turntable on which said mounting head is mounted, and said cam means comprises a first cam positioned adjacent said turntable and engageable by said lever to pivot said mounting chuck for moving a mounting chuck on said mounting head to the desired position.

8. An apparatus as claimed in claim 6 wherein said means for driving said mounting chucks comprises a pusher on the top of said turntable engageable with a positioned mounting chuck, and a depressing mechanism connected to said pusher for moving said pusher to cause said mounting chuck to be moved parallel to the axis of rotation of said turntable for picking up a part and for positioning the part on the printed circuit board.

9. An apparatus as claimed in claim 7 wherein said mounting chucks are rotatable on the corresponding mounting head around the longitudinal axes thereof, and said apparatus further comprises a sector gear rotatably mounted on each of said supporting shafts and in meshing engagement with the mounting chucks on the corresponding mounting head, a cam follower eccentrically mounted on each sector gear, and a second cam mounted adjacent said turntable for engaging said cam followers for rotating the mounting chucks to a desired position for picking up an electronic part oriented in the desired direction, and a third cam mounted adjacent said turntable for engaging said cam followers for rotating the mounting chucks for rotating the mounting chucks to a desired position for positioning the electronic part on the circuit board oriented in the desired direction.

* * * * *